US010157723B2

(12) United States Patent
Nanao et al.

(10) Patent No.: US 10,157,723 B2
(45) Date of Patent: Dec. 18, 2018

(54) MULTI CHARGED PARTICLE BEAM WRITING APPARATUS AND METHOD OF ADJUSTING THE SAME

(71) Applicant: NuFlare Technology, Inc., Yokohama-shi (JP)

(72) Inventors: Tsubasa Nanao, Yokohama (JP); Yukitaka Shimizu, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/665,839

(22) Filed: Aug. 1, 2017

(65) Prior Publication Data

US 2018/0040453 A1    Feb. 8, 2018

(30) Foreign Application Priority Data

Aug. 3, 2016  (JP) ................................. 2016-152947
Dec. 6, 2016  (JP) ................................. 2016-236860

(51) Int. Cl.
*H01J 37/04*  (2006.01)
*H01J 37/09*  (2006.01)
(Continued)

(52) U.S. Cl.
CPC ............ *H01J 37/09* (2013.01); *H01J 37/045* (2013.01); *H01J 37/20* (2013.01); *H01J 37/304* (2013.01);
(Continued)

(58) Field of Classification Search
USPC ... 250/305, 306, 307, 309, 310, 396 R, 397, 250/492.1, 492.2, 492.21, 492.22, 492.3
See application file for complete search history.

(56) References Cited

U.S. PATENT DOCUMENTS 9,299,535 B2 *   3/2016  Ogasawara ......... H01J 37/3177
2015/0041672 A1 * 2/2015  Kamikubo .......... H01J 37/3177
                                                              250/397
(Continued)

FOREIGN PATENT DOCUMENTS

JP       2005-302359       10/2005
JP       2006-510184        3/2006
(Continued)

OTHER PUBLICATIONS

Office Action dated Sep. 13, 2018, in Korean Patent Application No. 10-2017-0097549, citing document AO.

*Primary Examiner* — Bernard Souw
(74) *Attorney, Agent, or Firm* — Oblon, McClelland, Maier & Neustadt, L.L.P.

(57) ABSTRACT

In one embodiment, a multi charged particle beam writing apparatus includes an emitter that emits a charged particle beam, an aperture plate in which a plurality of openings are formed and that forms multiple beams by allowing the charged particle beam to pass through the plurality of openings, a blanking plate provided with a plurality of blankers that each perform blanking deflection on a corresponding beam included in the multiple beams, a stage on which a substrate irradiated with the multiple beams, a detector that detects a reflection charged particle from the substrate, feature amount calculation circuitry that calculates a feature amount of an aperture image based on a detection value of the detector, and aberration correction circuitry that corrects aberration of the charged particle beam based on the feature amount.

18 Claims, 10 Drawing Sheets

(51) Int. Cl.
   *H01J 37/153*   (2006.01)
   *H01J 37/317*   (2006.01)
   *H01J 37/20*    (2006.01)
   *H01J 37/304*   (2006.01)

(52) U.S. Cl.
   CPC ..... *H01J 37/3177* (2013.01); *H01J 2237/043* (2013.01); *H01J 2237/153* (2013.01); *H01J 2237/24475* (2013.01); *H01J 2237/30472* (2013.01)

(56) References Cited

U.S. PATENT DOCUMENTS

| | | | |
|---|---|---|---|
| 2015/0255249 A1* | 9/2015 | Ogasawara | H01J 37/3177 250/396 R |
| 2016/0148785 A1* | 5/2016 | Suganuma | H01J 37/3174 250/492.22 |
| 2018/0138012 A1* | 5/2018 | Iizuka | H01J 37/3177 |
| 2018/0138013 A1* | 5/2018 | Iizuka | H01J 37/3177 |
| 2018/0144905 A1* | 5/2018 | Iizuka | H01J 37/302 |

FOREIGN PATENT DOCUMENTS

| | | |
|---|---|---|
| JP | 2006-210503 | 8/2006 |
| JP | 2008-153209 | 7/2008 |
| JP | 2012-104426 | 5/2012 |
| JP | 2014-229481 | 12/2014 |
| JP | 2015-167212 | 9/2015 |
| KR | 10-2015-0028415 A | 3/2015 |

\* cited by examiner

Barrel Type

Pincushion Type

MULTI CHARGED PARTICLE BEAM WRITING APPARATUS AND METHOD OF ADJUSTING THE SAME

CROSS REFERENCE TO RELATED APPLICATION

This application is based upon and claims benefit of priority from the Japanese Patent Application No. 2016-152947, filed on Aug. 3, 2016, and the Japanese Patent Application No. 2016-236860, filed on Dec. 6, 2016, the entire contents of which are incorporated herein by reference.

FIELD

The present invention relates to a multi charged particle beam writing apparatus and a method of adjusting a multi charged particle beam writing apparatus.

BACKGROUND

The increasing integration of LSIs has led to finer and finer circuit line widths of semiconductor devices. An approach employed to form desired circuit patterns on semiconductor devices uses a step-and-repeat exposure system to reduce and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

For example, there are writing apparatuses that use multiple beams. The use of multiple beams can greatly improve the throughput because it enables irradiation with more beams at a time (in a single shot) than in the case where writing is performed using a single electron beam. In such multi-beam writing apparatuses, for example, multiple beams are formed by letting an electron beam emitted from an electron gun pass through an aperture member having a plurality of apertures. Blanking control is performed on each of the beams. Unblocked beams are each reduced by an optical system, and a substrate placed on a movable stage is irradiated with the resulting beams.

In an aperture member that forms multiple beams, holes in m columns×n rows (where m, n≥2) are formed at predetermined array pitch in a matrix. Thus, the shape (aperture image) of the overall multiple beams with which a substrate is irradiated is ideally a rectangular shape. However, under the influence of spherical aberration of an electron optical system provided with a writing apparatus, a shape where four sides on the outer edge of the beam shape project outside or a shape where the four sides are depressed inside may be caused.

It has been difficult to assess such specific beam shapes and automatically adjust spherical aberration.

DETAILED DESCRIPTION

In one embodiment, a multi charged particle beam writing apparatus includes an emitter that emits a charged particle beam, an aperture plate in which a plurality of openings are formed and that forms multiple beams by allowing the charged particle beam to pass through the plurality of openings, a blanking plate provided with a plurality of blankers that each perform blanking deflection on a corresponding beam included in the multiple beams, a limitation aperture plate that blocks each of beams deflected by the plurality of blankers so as to enter a beam-OFF state, a stage on which a substrate irradiated with the multiple beams, a detector that detects a reflection charged particle from the substrate, feature amount calculation circuitry that calculates a feature amount of an aperture image based on a detection value of the detector, and aberration correction circuitry that corrects aberration of the charged particle beam based on the feature amount.

An embodiment of the present invention will be described below with reference to the drawings.

Figure 1:
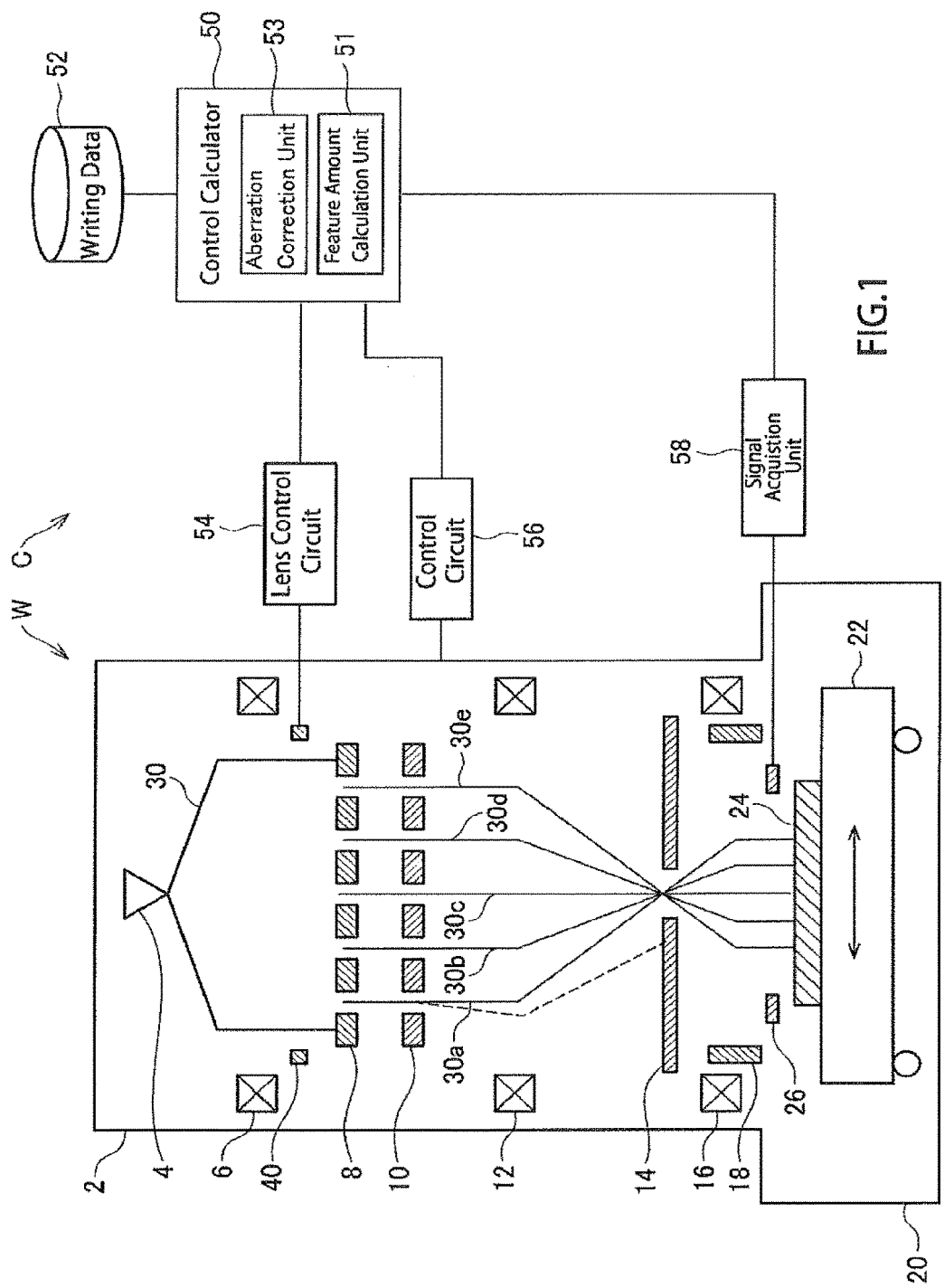
FIG. 1 is a schematic diagram of a multi charged particle beam writing apparatus according to an embodiment of the present invention.

FIG. 1 is a schematic diagram of a multi charged particle beam writing apparatus according to an embodiment of the present invention. In the present embodiment, a configuration where an electron beam is used as an example of a charged particle beam is described. It should be noted that the charged particle beam is not limited to an electron beam and may be another charged particle beam, such as an ion beam.

The writing apparatus includes a writing unit W, which irradiates a substrate 24 as a writing object with an electron beam and writes a desired pattern, and a control unit C, which controls operation of the writing unit W.

The writing unit W includes an electron beam barrel 2 and a writing chamber 20. In the electron beam barrel 2, an electron gun 4, an illumination lens 6, an aperture member 8 (an aperture plate), a blanking aperture array 10, a reduction lens 12, an alignment coil 13, a limitation aperture member 14 (a limitation aperture plate), an objective lens 16, a deflector 18, and an aberration correction lens 40 are arranged.

The aberration correction lens 40 is arranged between the illumination lens 6 and the aperture member 8 and for example, employs a foil lens.

In the writing chamber 20, an XY stage 22 and a detector 26 are arranged. On the XY stage 22, the substrate 24 as the writing object is placed. The substrate 24 as the writing object includes for example, a wafer and a mask for exposure to light, which transfers a pattern onto the wafer using a reduction-projection-type photolithographic device or an extreme-ultraviolet photolithographic device (EUV), such as a stepper or a scanner where an excimer laser serves as a light source.

Figure 2:
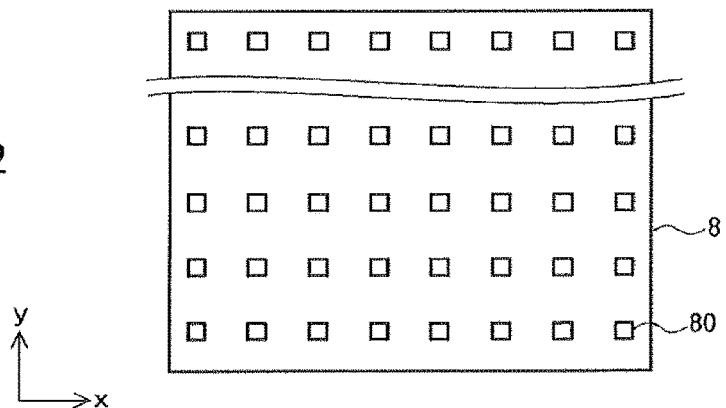
FIG. 2 is a schematic diagram of an aperture member.

An electron beam 30 emitted from the electron gun 4 illuminates the whole aperture member 8 approximately vertically through the illumination lens 6. FIG. 2 is a conceptual diagram that illustrates a configuration of the aperture member 8. In the aperture member 8, holes (openings) 80 in m columns (in the y direction)×n rows (in the x direction) (where m, n≥2) are formed at predetermined array pitch in a matrix. For example, the holes 80 in 512 columns× 512 rows are formed. Each hole 80 is formed to have a rectangular shape identical in size and shape to the others. Each hole 80 may have a circular shape with an identical diameter.

The electron beam 30 illuminates a region that includes all of the holes 80 of the aperture member 8. Part of the electron beam 30 passes through each of the plurality of holes 80 and accordingly, multiple beams 30a to 30e illustrated in FIG. 1 are formed.

How the holes 80 are arranged is not limited to a case where the columns and rows are arranged in a lattice configuration as illustrated in FIG. 2. For example, the holes adjacent to each other in a longitudinal direction may be alternately arranged in a staggered configuration.

In the blanking aperture array 10, through-holes are formed to correspond to the respective arrangement positions of the holes 80 of the aperture member 8 and each through-hole is provided with a blanker constituted of two electrodes that make a pair. The electron beams 30a to 30e that pass through the respective through-holes each undergo deflection according to the voltage applied by the blanker, independently. Through the deflection, each beam undergoes blanking control. In this manner, with the blanking aperture array 10, blanking deflection is performed on each beam of the multiple beams that have passed through the plurality of holes 80 of the aperture member 8.

The multiple beams 30a to 30e that have passed through the blanking aperture array 10 are reduced in each individual beam size and array pitch by the reduction lens 12 and proceed to a central hole formed in the limitation aperture member 14. The alignment coil 13 adjusts an optical axis so that the multiple beams pass through the center of the hole of the limitation aperture member 14.

The electron beams deflected by the blankers of the blanking aperture array 10 are displaced in courses thereof and miss the position of the hole of the limitation aperture member 14, and are blocked by the limitation aperture member 14. In contrast, the electron beams not deflected by the blankers of the blanking aperture array 10 pass through the hole of the limitation aperture member 14.

In this manner, the limitation aperture member 14 blocks each of the beams deflected by the electrodes of the blanking aperture array 10 so as to enter a beam-OFF state. The beams that have passed through the limitation aperture member 14 before becoming OFF after having become ON serve as one shot of beams.

The multiple beams 30a to 30e that have passed through the limitation aperture member 14 are focused by the objective lens 16 and constitute a pattern image with a desired reduction rate. The individual beams that have passed through the limitation aperture member 14 (the overall multiple beams) are collectively deflected by the deflector 18 in the same direction and the substrate 24 is irradiated with the deflected beams. The detector 26 detects reflection electrons (secondary electrons) from the substrate 24.

The multiple beams used in single irradiation are ideally aligned at the pitch that results from multiplying the array pitch of the plurality of holes 80 of the aperture member 8 by the above-described desired reduction rate. The writing apparatus performs writing operations in a raster scan mode where irradiation of shot beams is conducted continuously and sequentially, and when a desired pattern is written, the beams necessary according to the pattern are controlled through the blanking control so as to be ON. When the XY stage 22 moves continuously, the irradiation positions of the beams are controlled by the deflector 18 so as to follow the move of the XY stage 22.

The control unit C includes a control calculator 50, a storage device 52, a lens control circuit 54, a control circuit 56, and a signal acquisition circuit 58. The control calculator 50 acquires writing data from the storage device 52 and performs a data conversion process at a plurality of stages on the writing data to generate shot data unique to the device and outputs the shot data to the control circuit 56. In the shot data, the irradiation amount and irradiation position coordinates of each shot and the like are defined. The control calculator 50 includes a feature amount calculation unit 51 and an aberration correction unit 53.

The control circuit 56 controls each unit of the writing unit W and performs a writing process. For example, the control circuit 56 determines irradiation time t by dividing the irradiation amount of each shot by current density and when a corresponding shot is performed, applies deflection voltage to the corresponding blankers of the blanking aperture array 10 so that the beams are ON only during the irradiation time t.

Further, the control circuit 56 calculates a deflection amount so that each beam is deflected to the position (coordinates) indicated by the shot data, and applies the deflection voltage to the deflector 18. Accordingly, the multiple beams shot at the time concerned are collectively deflected.

Figure 3A:
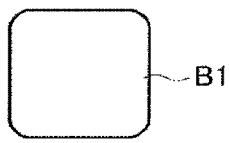
FIGS. 3A to 3C are diagrams that illustrate examples of an aperture image.

The substrate 24 is irradiated with the multiple beams formed by passing through the plurality of holes 80 of the aperture member 8. As described above, in the aperture member 8, the holes 80 in m columns (in the y direction)×n rows (in the x direction) (m, n≥2) are formed. Thus, an image indicating the shape of the overall multiple beams with which the substrate 24 is irradiated, which may be hereinafter simply referred to as an "aperture image", is ideally a quadrilateral (a substantially quadrilateral shape) like multiple beams B1 illustrated in FIG. 3A.

Figure 3B:
Figure 3C:
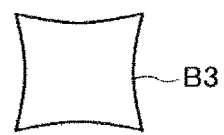

However, in a multi-beam writing apparatus, under the influence of spherical aberration of a lens, the aperture image may be distorted and may have a barrel-type shape like beams B2 illustrated in FIG. 3B, where the four sides on the outer edge of the aperture image project outside, or have a pincushion-type shape like beams B3 illustrated in FIG. 3C, where the four sides on the outer edge are depressed inside.

In the present embodiment, a feature amount indicating a feature of an aperture image is calculated and on the basis of the calculated feature amount, spherical aberration is adjusted. The control calculator 50 obtains an aperture image on the basis of a detection value of the detector 26, which is acquired through the signal acquisition circuit 58. The feature amount calculation unit 51 calculates the feature amount of the aperture image. The aberration correction unit 53 calculates a voltage applied to the aberration correction lens 40 on the basis of the calculated feature amount. The aberration correction unit 53 controls the lens control circuit 54 so that the voltage applied to the aberration correction lens 40 becomes the calculated voltage, corrects spherical aberration, and performs adjustment so that the aperture image becomes a desired shape (a quadrilateral).

The feature amount calculation unit 51 generates a quadrilateral that approximates the obtained aperture image to determine an area of a region positioned inside the approximate quadrilateral, an area of a region positioned outside the approximate quadrilateral, the areas being included in the aperture image, an area of a region positioned inside the approximate quadrilateral and outside the aperture image, and the like, and calculates the ratio of these as a feature amount.

Figure 4A:
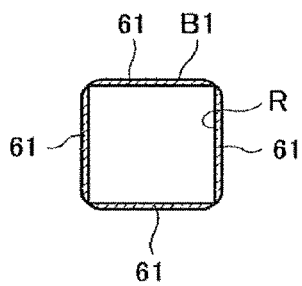
FIGS. 4A to 4C are diagrams that illustrate a method of calculating a feature amount of an aperture image.

For example, as illustrated in FIG. 4A, as regards the substantially quadrilateral beams B1, most of the aperture image is positioned inside an approximate quadrilateral R and the area of a region 61 positioned outside the approximate quadrilateral R is small. Further, a region inside the approximate quadrilateral R and outside the aperture image is zero or almost absent.

Figure 4B:
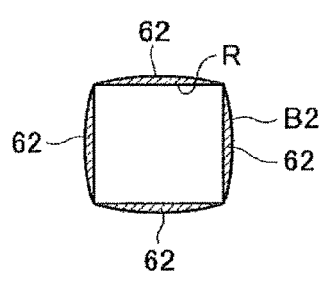

As illustrated in FIG. 4B, as regards the barrel-type beams B2, similar to the substantially quadrilateral beams B1 illustrated in FIG. 4A, much of the aperture image is positioned inside the approximate quadrilateral R but the area of a region 62 positioned outside the approximate quadrilateral R is larger than the area of the region 61 in FIG. 4A. A region inside the approximate quadrilateral R and outside the aperture image is zero or almost absent.

Figure 4C:
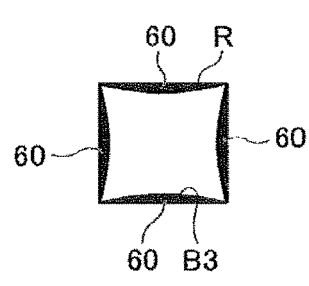

As illustrated in FIG. 4C, as regards the pincushion-type beams B3, the area of a region 60 inside the approximate quadrilateral R and outside the aperture image is larger than those of the substantially quadrilateral beams B1 and the barrel-type beams B2. Besides, the area of the aperture image positioned outside the approximate quadrilateral R is exceedingly small.

As described above, as regards the substantially quadrilateral beams B1 having an ideal beam shape, the area of the region 61 positioned outside the approximate quadrilateral R is small while the region inside the approximate quadrilateral R and outside the aperture image is zero or almost absent. Thus, the aberration correction unit 53 controls the voltage applied to the aberration correction lens 40 by using the lens control circuit 54 and corrects the spherical aberration so that the area of the region positioned outside the approximate quadrilateral R is within a predetermined range and the region inside the approximate quadrilateral R and outside the aperture image is smaller than or equal to a predetermined value.

Figure 5A:
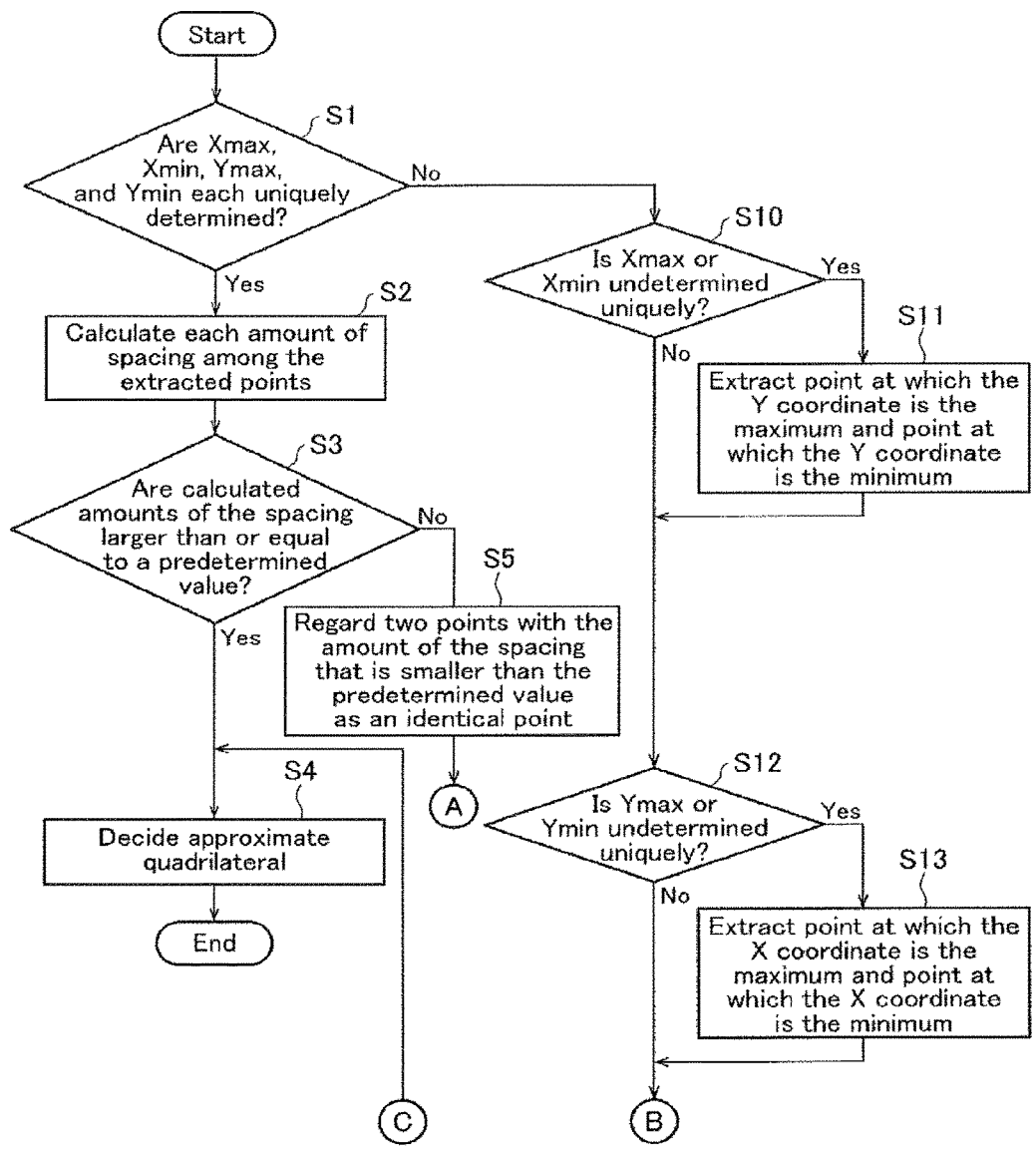
FIGS. 5A and 5B are flow charts for describing a method of calculating a quadrilateral that approximates an aperture image.
Figure 5B:
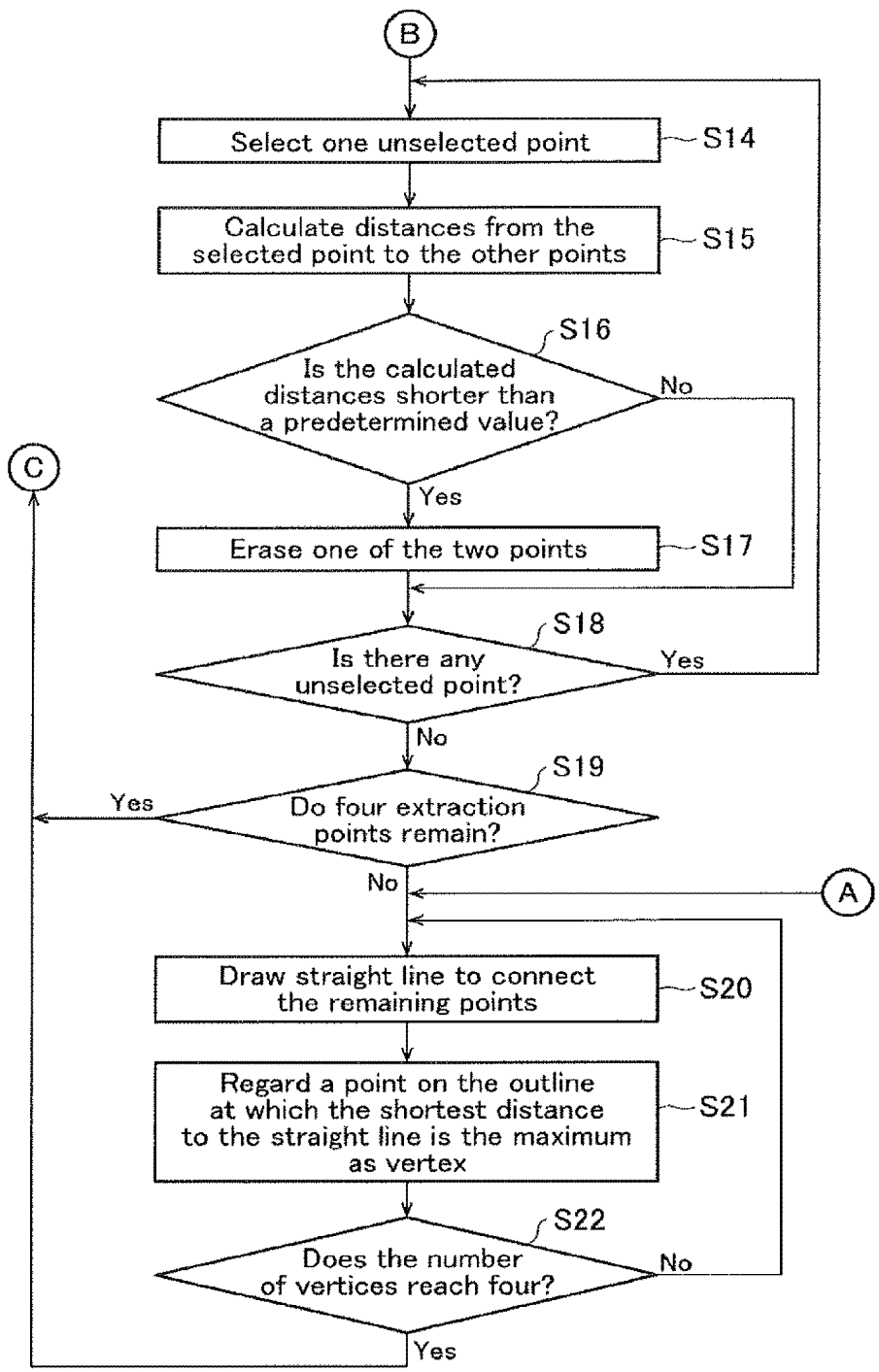

Next, a method of calculating the quadrilateral R that approximates an aperture image is described using a flow chart illustrated in FIGS. 5A and 5B. The approximate quadrilateral R is decided by calculating four vertices.

When an aperture image is obtained on the basis of the detection value of the detector 26 acquired through the signal acquisition circuit 58, on the outline of the aperture image, the feature amount calculation unit 51 extracts the respective points at which the X coordinate and the Y coordinate are the maximum and the respective points at which the X coordinate and the Y coordinate are the minimum. The point at which the X coordinate is the maximum is referred to as Xmax, the point at which the X coordinate is the minimum is referred to as Xmin, the point at which the Y coordinate is the maximum is referred to as Ymax, and the point at which the Y coordinate is the minimum is referred to as Ymin. When Xmax, Xmin, Ymax, and Ymin are each uniquely determined (step S1_Yes), each amount of spacing among the extracted points is calculated (step S2).

Figure 6:
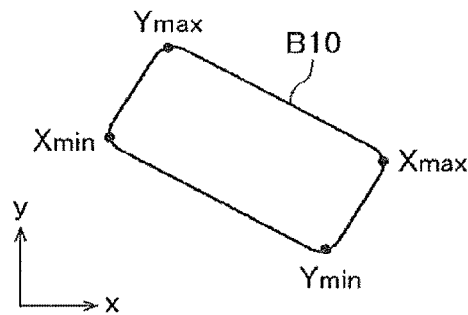
FIG. 6 is a diagram for describing how to determine an approximate quadrilateral.

When all of the calculated amounts of the spacing are larger than or equal to a predetermined value (step S3_Yes), as illustrated in FIG. 6, Xmax, Xmin, Ymax, and Ymin can serve as the respective vertices of a quadrilateral that approximates an aperture image B10 and an approximate quadrilateral is decided (step S4).

Figure 7:
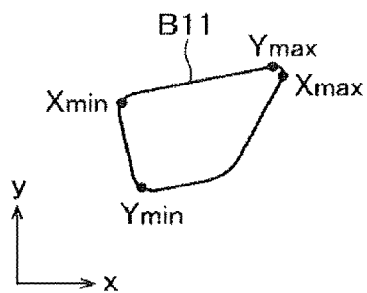
FIG. 7 is a diagram for describing how to determine an approximate quadrilateral.

When any of the calculated amounts of the spacing is smaller than the predetermined value (e.g. one-tenth length of one side of an assumed quadrilateral) (step S3_No), two points with the amount of the spacing that is smaller than the predetermined value are regarded as an identical point (step S5). For example, the amount of the spacing between Xmax and Ymax illustrated in FIG. 7 is smaller than the predetermined value, and Xmax and Ymax correspond to an identical vertex of a quadrilateral that approximates an aperture image B11. When two points are regarded as an identical point, the number of vertices needed to decide an approximate quadrilateral (=4) is insufficient and accordingly, the process proceeds to step S20. The operations after step S20 are described below.

Figure 8:
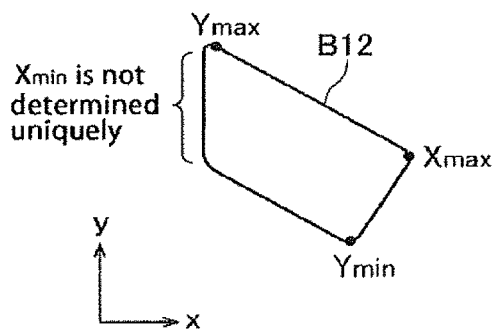
FIG. 8 is a diagram for describing how to determine an approximate quadrilateral.

Depending on an aperture image, Xmax, Xmin, Ymax, and Ymin may not be each uniquely determined (step S1_No). For example, as for an aperture image B12 illustrated in FIG. 8, Xmin is not determined uniquely.

When Xmax or Xmin is undetermined uniquely (step S10_Yes), a point at which the Y coordinate is the maximum and a point at which the Y coordinate is the minimum are extracted from among a plurality of candidates (step S11). For instance, in the example illustrated in FIG. 8, Xmin is undetermined uniquely and thus, as illustrated in FIG. 9, the point at which the Y coordinate is the maximum, Xmin_ymax and the point at which the Y coordinate is the minimum, Xmin_ymin are extracted from among the candidates that can be Xmin.

Similarly, when Ymax or Ymin is undetermined uniquely (step S12_Yes), a point at which the X coordinate is the maximum and a point at which the X coordinate is the minimum are extracted from among a plurality of candidates (step S13).

Subsequently, one unselected point is selected from among the plurality of extraction points on the outline of the aperture image (step S14). Then, distances from the selected point to the other extraction points are calculated (step S15). When any of the calculated distances is shorter than a predetermined value (step S16_Yes), one of the two points with the distance that is shorter than the predetermined value is erased (step S17). When there is any unselected point (step S18_Yes), the process returns to step S14. Similar operations are performed on all of the extraction points on the outline of the aperture image. When four extraction points remain after the operations of steps S14 to S18 (step S19_Yes), the four points can serve as the vertices of a quadrilateral that approximates the aperture image and an approximate quadrilateral is decided (step S4).

Figure 9:
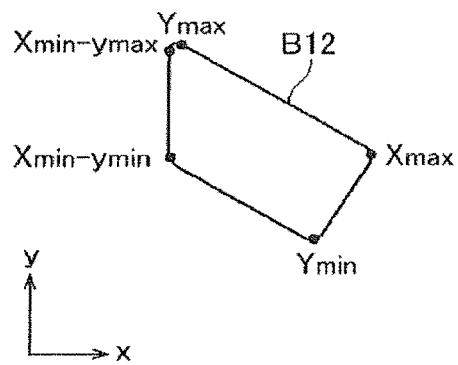
FIG. 9 is a diagram for describing how to determine an approximate quadrilateral.

For instance, in the example illustrated in FIG. 9, the distance from Ymax to Xmin_ymax is shorter than the predetermined value and thus, one of Ymax and Xmin_ymax is erased. Consequently, four points, which are Xmax, Xmin_ymin, Ymax (or Xmin_ymax), and Ymin, remain on the outline of the aperture image B12 and an approximate quadrilateral where the four points serve as its vertices is decided.

Instead of erasing one of two points with a distance that is shorter than the predetermined value in step S17, a midpoint between the two points on the outline may be newly extracted and the two points may be erased. For instance, in the example in FIG. 9, a midpoint between Ymax and Xmin_ymax on the outline of the aperture image B12 may be newly extracted and then Ymax and Xmin_ymax may be erased.

Figure 10A:
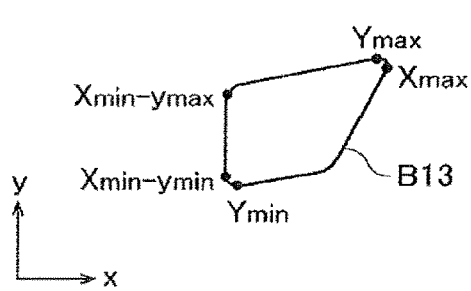
FIGS. 10A and 10B are diagrams for describing how to determine an approximate quadrilateral.
Figure 10B:
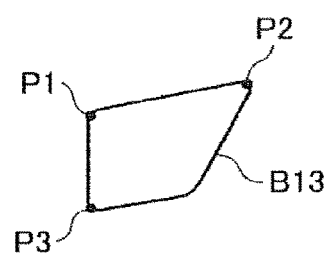

Depending on an aperture image, as a result of the point erasure in step S17, the number of remaining extraction points becomes three or less (step S19_No). For example, when the operations of step S14 to S18 are performed on an aperture image B13 illustrated in FIG. 10A, Ymin and Xmin_ymin are processed into one point. Further, Xmax and Ymax are processed into one point. Accordingly, as illustrated in FIG. 10B, only three vertices remain, which are points P1, P2, and P3.

In such a case, a straight line is drawn to connect the remaining vertices (step S20). For example, as illustrated in FIG. 11A, a straight line L1 that passes through the points P2 and P3 is drawn, a straight line L2 that passes through the points P1 and P3 is drawn, and a straight line L3 that passes through the points P1 and P2 is drawn.

Subsequently, the shortest distance from a point on the outline of the aperture image to the straight line drawn in step S20 is determined. When a plurality of straight lines are drawn, the shortest of the respective shortest distances to the straight lines is determined. Then, a point at which the determined shortest distance is the maximum is regarded as a vertex (step S21). The operations of steps S20 and S21 are repeated until the number of vertices reaches four. When the number of vertices reaches four (step S22_Yes), the four vertices can serve as the vertices of a quadrilateral that approximates the aperture image and an approximate quadrilateral is decided (step S4).

Figure 11A:
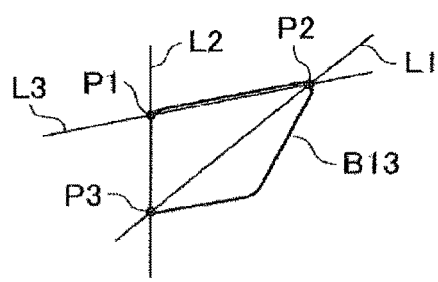
FIGS. 11A and 11B are diagrams for describing how to determine an approximate quadrilateral.
Figure 11B:
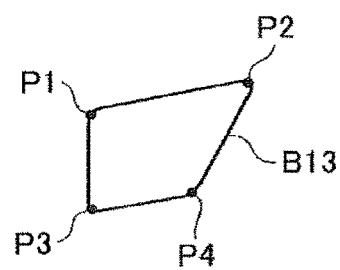

For example, a point at which the shortest distance to the straight lines L1, L2, and L3 illustrated in FIG. 11A is the maximum is a point P4 illustrated in FIG. 11B. The quadrilateral where the points P1, P2, P3, and P4 serve as its vertices is a quadrilateral that approximates the aperture image B13.

In this manner, a quadrilateral that approximates an aperture image is calculated, and the area of the aperture image positioned outside the approximate quadrilateral and the area of a region inside the approximate quadrilateral and outside the aperture image are determined to control the voltage applied to the aberration correction lens 40 and correct the spherical aberration.

Figure 12:
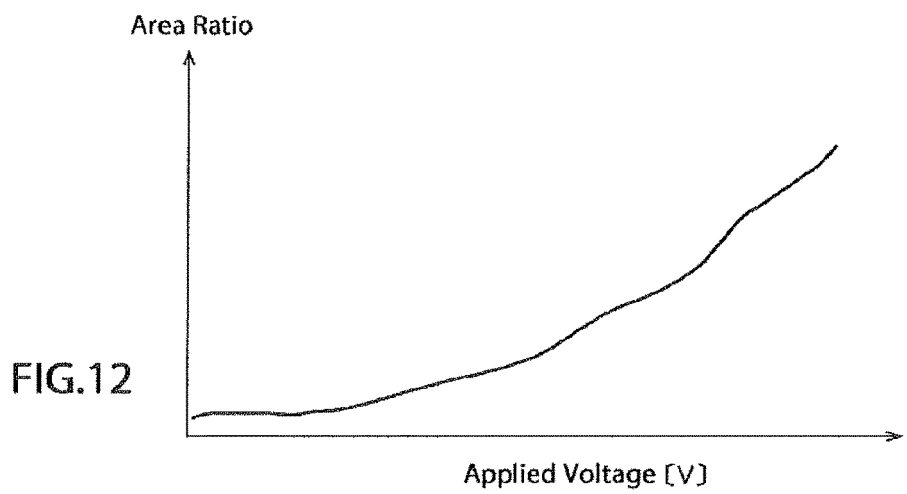
FIG. 12 is a graph that illustrates an example of relation between an aperture image area ratio and aberration correction lens voltage.

For example, the relation between the ratio of the area of the aperture image positioned outside the approximate quadrilateral to the entire area of the aperture image and the voltage applied to the aberration correction lens 40 has tendencies illustrated in FIG. 12. Thus, the aberration correction unit 53 controls the voltage applied to the aberration correction lens 40 so that the ratio of the area indicates a desired value by using the lens control circuit 54. Accordingly, the spherical aberration can be automatically adjusted so that the aperture image becomes a quadrilateral (a substantially quadrilateral shape). The ratio of the area as an adjustment object is extra determined according to writing accuracy and the like. Further, since the ratio of the area rises as the applied voltage becomes higher, the ratio of the area can be adjusted by binary search at the time of the automatic adjustment.

In this manner, according to the present embodiment, an approximate quadrilateral of an aperture image (a beam shape) is used to calculate the feature amount of the aperture image and the spherical aberration is adjusted on the basis of the feature amount and thus, the spherical aberration of an optical system in irradiation with multiple beams can be automatically adjusted with accuracy.

Although in the above-described embodiment, the area positioned outside an approximate quadrilateral of an aperture image or the like serves as the feature amount, the feature amount is not limited thereto. For example, the ratio between a diagonal line of the approximate quadrilateral and the length of the outer edge (the outline) of the aperture image may serve as the feature amount.

Figure 13A:
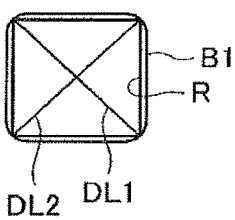
FIGS. 13A to 13C are diagrams that illustrate a method of calculating a feature amount of an aperture image according to another embodiment.
Figure 13B:
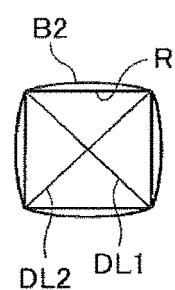
Figure 13C:
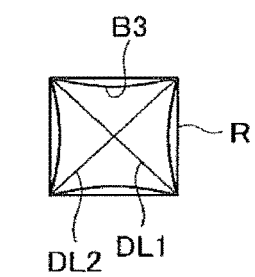

FIGS. 13A, 13B, and 13C illustrate diagonal lines DL1 and DL2 of the approximate quadrilaterals R of the substantially quadrilateral beams B1, the barrel-type beams B2, and the pincushion-type beams B3. Compared to the substantially quadrilateral beams B1, as regards the barrel-type beams B2 and the pincushion-type beams B3, the ratio of for example, the length of the longer one of the diagonal lines to the length of the length of the outer edge is small. The aberration correction unit 53 controls the voltage applied to the aberration correction lens 40 by using the lens control circuit 54 and adjusts the spherical aberration so that this ratio becomes large (larger than or equal to a predetermined value).

Standard deviation in distribution of brightness (illuminance) in an aperture image may serve as the feature amount. For example, as regards substantially quadrilateral beams, the brightness in an aperture image is approximately uniform and standard deviation is small. As regards barrel-type beams, it is dark in a central portion and bright in an outer edge portion, and standard deviation is large. As regards pincushion-type beams, it is bright in a central portion and darker toward the outer edge, and standard deviation is large. The aberration correction unit 53 controls the voltage applied to the aberration correction lens 40 by using the lens control circuit 54 and adjusts the spherical aberration so that the standard deviation becomes small (smaller than or equal to a predetermined value).

The spherical aberration adjustment method according to the present embodiment can be applied to cases where an aperture image becomes shapes other than a square. For example, when the shape of the aperture image is a rectangle, the shape of the aperture image is changed on the basis of the ratio between a long side and a short side and the spherical aberration is adjusted according to the above-described embodiment. For another example, the spherical aberration is adjusted so that the standard deviation of the illuminance becomes small.

When the shape of the aperture image is a circular shape, the adjustment is performed so that the ratio between the diameter of the aperture image and the length of the outer edge becomes small. For another example, the spherical aberration is adjusted so that the standard deviation of the illuminance becomes small.

Although the embodiment above describes a configuration in which the spherical aberration is corrected using the aberration correction lens 40, a foil lens as the aberration correction lens, and in addition, for example, a combination of a lattice lens and a correction lens, and an aberration corrector using a multipole electromagnetic field may also be employed. An aberration correction lens can decrease spherical aberration components of beams by causing axially symmetric electric fields and magnetic fields through an electrostatic lens or a coil.

As illustrated in FIG. 2, in the aperture member 8 that forms multiple beams, the holes 80 in m columns×n rows are formed at predetermined array pitch in a matrix. The approximate quadrilateral of an aperture image is ideally a rectangular shape, and particularly when m=n, is a square. However, under the influence of astigmatic aberration, the aperture image may be distorted and the shape of the approximate quadrilateral may fail to be a square. To increase the viewability of an aperture image, a focal point may be deviated as suitable only at the time of adjustment.

Figure 14:
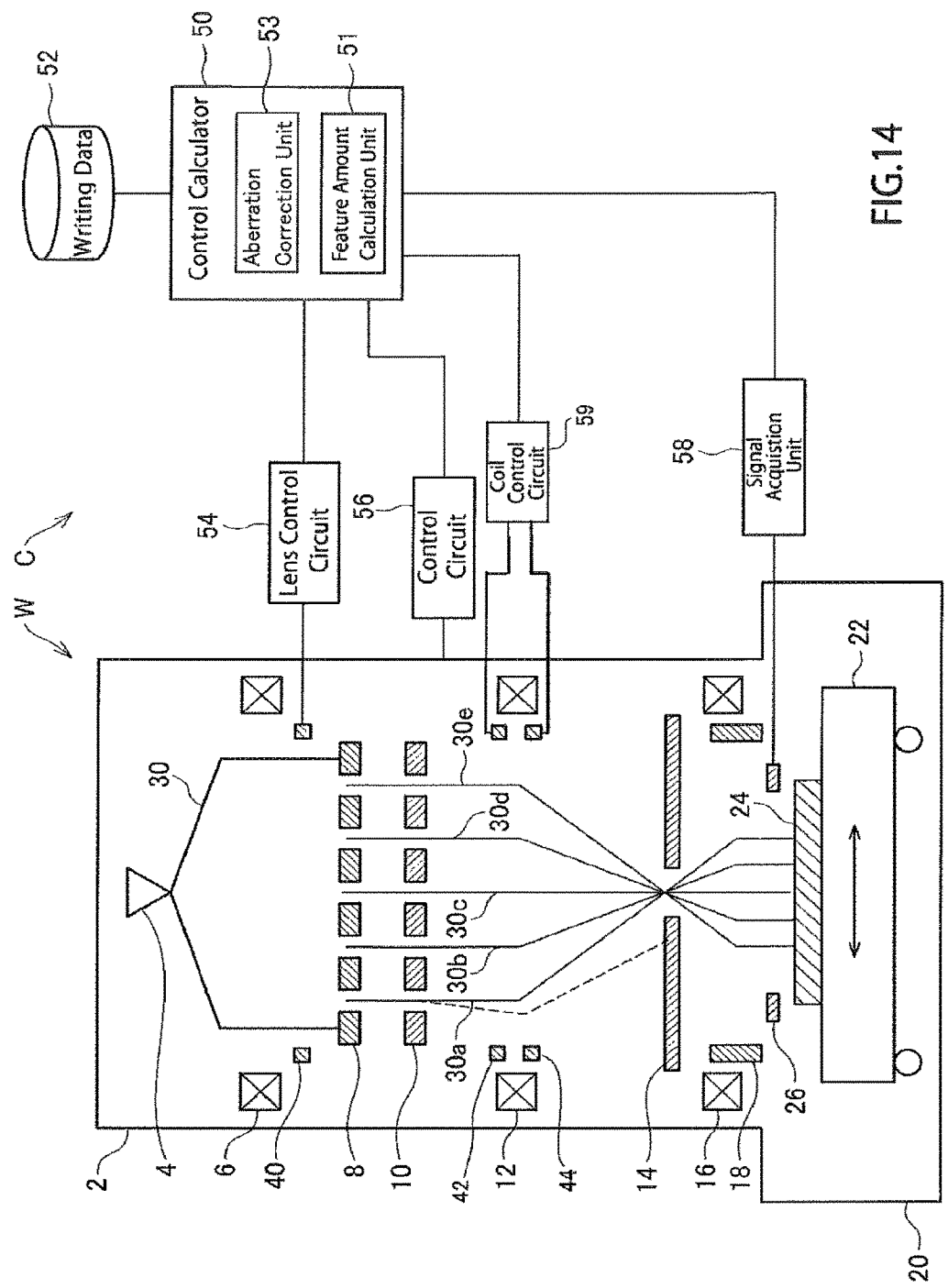
FIG. 14 is a schematic diagram that illustrates a multi charged particle beam writing apparatus according to another embodiment.

Thus, as illustrated in FIG. 14, astigmatic adjustment coils 42 and 44, which correct (adjust) astigmatic aberration of multiple beams, and a coil control circuit 59, which controls excitation values (astigmatic correction coil values) to excite the astigmatic adjustment coils 42 and 44, may be provided to perform the astigmatic adjustment. The astigmatic adjustment coils 42 and 44 respectively perform the astigmatic adjustment in a first axis direction and a second axis direction (e.g. the x axis direction and the y axis direction) that are orthogonal to each other in a horizontal plane.

Figure 15:
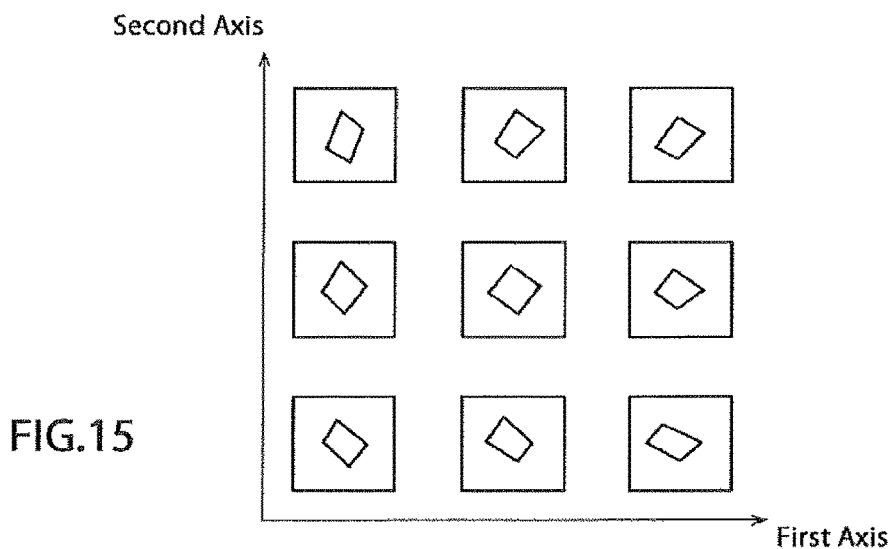
FIG. 15 is a diagram that illustrates an example of change in shape of an aperture image accompanied by change in astigmatic correction coil values.

As illustrated in FIG. 15, when the astigmatic correction coil values for the astigmatic adjustment coils 42 and 44 are each changed, the shape of the approximate quadrilateral of the aperture image changes.

The feature amount calculation unit 51 calculates the feature amount that indicates the squareness of the approximate quadrilateral of the aperture image. The aberration correction unit 53 controls the astigmatic correction coil values set for the astigmatic adjustment coils 42 and 44 on the basis of the calculated feature amount by using the coil control circuit 59, corrects the astigmatic aberration, and performs adjustment so that the shape of the approximate quadrilateral of the aperture image becomes a square.

A method of calculating a feature amount indicating the squareness of an approximate quadrilateral of an aperture image is described. By the method described in the embodiment above, the feature amount calculation unit 51 calculates an approximate quadrilateral of an aperture image on the basis of the detection value of the detector 26. A square is a graphic where the lengths of four sides are equal and four interior angles are equal (all right-angled). Thus, the feature amount calculation unit 51 calculates at least one of a first feature amount, which indicates variation in the lengths of the four sides of the approximate quadrilateral, and a second feature amount, which indicates variation in the degrees of the four interior angles of the approximate quadrilateral.

Figure 16:
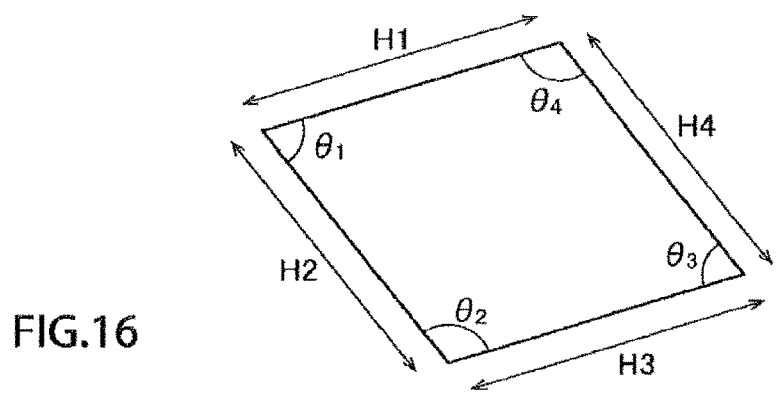
FIG. 16 is a diagram for describing a method of calculating a feature amount of an aperture image.
Figure 17:
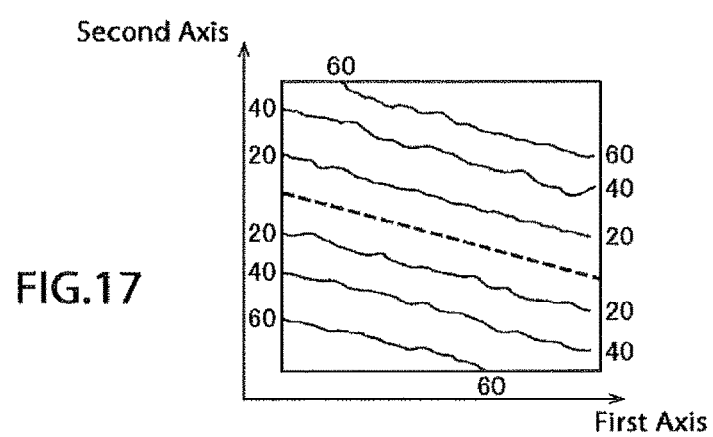
FIG. 17 is a diagram that illustrates an example of a calculation result of a first feature amount.

For example, as regards the approximate quadrilateral illustrated in FIG. 16, the feature amount calculation unit 51 calculates standard deviation (or variance) in lengths H1, H2, H3, and H4 of the four sides as the first feature amount. Changing the setting of the astigmatic correction coil values and calculating the first feature amount are repeated so that the first feature amount becomes small. FIG. 17 is a graph that illustrates the relation between the astigmatic correction coil values set for the astigmatic adjustment coils 42 and 44 and the first feature amount calculated. By causing the astigmatic correction coil values set for the astigmatic adjustment coils 42 and 44 to be the values indicated by the broken line in FIG. 17, the lengths H1, H2, H3, and H4 of the four sides of the approximate quadrilateral is caused to be approximately equal.

Further, for example, as regards the approximate quadrilateral illustrated in FIG. 16, the feature amount calculation unit 51 calculates the sum of the inner-product squares of four interior angles $\theta_1$, $\theta_2$, $\theta_3$, and $\theta_4$ as the second feature amount. The sum of the inner-product squares is calculated using the following expression:

$$(\cos \theta_1)^2 + (\cos \theta_2)^2 + (\cos \theta_3)^2 + (\cos \theta_4)^2$$

Figure 18:
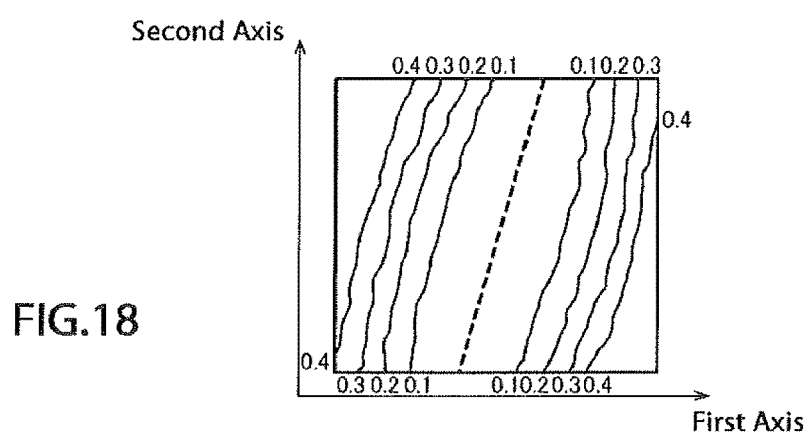
FIG. 18 is a diagram that illustrates an example of a calculation result of a second feature amount.

The second feature amount indicates the squareness of the four interior angles $\theta_1$, $\theta_2$, $\theta_3$, and $\theta_4$ and when the approximate quadrilateral is a square, the second feature amount is zero. Changing the setting of the astigmatic correction coil values and calculating the second feature amount are repeated so that the second feature amount becomes small. FIG. 18 is a graph that illustrates the relation between the astigmatic correction coil values set for the astigmatic adjustment coils 42 and 44 and the second feature amount calculated. By causing the astigmatic correction coil values set for the astigmatic adjustment coils 42 and 44 to be the values indicated by the broken line in FIG. 18, the four interior angles $\theta_1$, $\theta_2$, $\theta_3$, and $\theta_4$ become approximately 90°.

Both of the first feature amount and the second feature amount may be used to control the astigmatic correction coil values and perform the astigmatic adjustment. In this case, the second feature amount can be adjusted so as to be small by changing the first axis and the first feature amount can be adjusted so as to be small by changing the second axis.

When the shape of the approximate quadrilateral of an ideal aperture image is a rectangle, the astigmatic correction coil values are controlled so that the above-described first feature amount indicates a predetermined value based on the ratio between a long side and a short side. When the shape of the approximate quadrilateral is a shape other than a rectangular shape, and when it is for example, a circular shape, the astigmatic correction coil values may be adjusted on the basis of the ratio between the diameter of the aperture image and the length of the outer edge, and when it is a hexagon, the adjustment may be performed by regarding the hexagon as a circular shape. Further, adjustment may be performed on the optical system so as to decrease the standard deviation (variance) in illuminance of the aperture image.

Instead of the aperture member 8 or the blanking aperture array 10, a plate for adjustment provided with an opening may be placed to perform the astigmatic adjustment. In this case, a feature amount appropriate to the opening provided in the plate for adjustment is chosen.

At least part of the control calculator 50 including the feature amount calculation unit 51 and the aberration correction unit 53 described in the above embodiments may be implemented in either hardware including electric circuits (circuitry) or software. When implemented in software, a program that realizes at least part of functions of the control calculator 50 may be stored on a recording medium such as a flexible disk or CD-ROM and read and executed by a computer including electric circuits (circuitry). The recording medium is not limited to a removable recording medium such as a magnetic disk or optical disk, but may be a non-removable recording medium such as a hard disk device or memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
   an emitter that emits a charged particle beam;
   an aperture plate in which a plurality of openings are formed and that forms multiple beams by allowing the charged particle beam to pass through the plurality of openings;
   a blanking plate provided with a plurality of blankers that each perform blanking deflection on a corresponding beam included in the multiple beams;
   a limitation aperture plate that blocks each of beams deflected by the plurality of blankers so as to enter a beam-OFF state;
   a stage on which a substrate is irradiated with the multiple beams;
   a detector that detects a reflection charged particle from the substrate;
   feature amount calculation circuitry that calculates a feature amount of an aperture image based on a detection value of the detector; and
   aberration correction circuitry that corrects aberration of the charged particle beam based on the feature amount.

2. The apparatus according to claim 1, wherein
   the feature amount calculation circuitry generates an approximate graphic that approximates the aperture image, and calculates the feature amount using an area of the aperture image positioned at least one of inside and outside the approximate graphic, and
   the aberration correction circuitry corrects spherical aberration of the charged particle beam based on the feature amount.

3. The apparatus according to claim 1, wherein
   the feature amount calculation circuitry generates an approximate quadrilateral that approximates the aperture image, and calculates a ratio between a length of a longer one of diagonal lines of the approximate quadrilateral and a length of an outer edge of the aperture image as the feature amount, and
   the aberration correction circuitry corrects spherical aberration of the charged particle beam based on the feature amount.

4. The apparatus according to claim 1, wherein
   the feature amount calculation circuitry calculates standard deviation of illuminance in the aperture image as the feature amount, and
   the aberration correction circuitry corrects spherical aberration of the charged particle beam based on the feature amount.

5. The apparatus according to claim 1, wherein
   the feature amount calculation circuitry generates a rectangle that approximates the aperture image, and calculates a ratio between a long side and a short side of the rectangle as the feature amount, and
   the aberration correction circuitry corrects spherical aberration of the charged particle beam based on the feature amount.

6. The apparatus according to claim 1, wherein
   the feature amount calculation circuitry generates a circle that approximates the aperture image, and calculates a ratio between a diameter of the circle and a length of an outer edge of the aperture image as the feature amount, and
   the aberration correction circuitry corrects spherical aberration of the charged particle beam based on the feature amount.

7. The apparatus according to claim 1, wherein
   the feature amount calculation circuitry generates an approximate quadrilateral that approximates the aperture image, and calculates variation in lengths of four sides of the approximate quadrilateral as a first feature amount, and
   the aberration correction circuitry corrects astigmatic aberration of multiple beams based on the first feature amount.

8. The apparatus according to claim 1, wherein
   the feature amount calculation circuitry generates an approximate quadrilateral that approximates the aperture image, and calculates squareness of four interior angles of the approximate quadrilateral as a second feature amount, and
   the aberration correction circuitry corrects astigmatic aberration of multiple beams based on the second feature amount.

9. The apparatus according to claim 1, wherein
   the feature amount calculation circuitry generates an approximate quadrilateral that approximates the aperture image, calculates variation in lengths of four sides of the approximate quadrilateral as a first feature amount, and calculates squareness of four interior angles of the approximate quadrilateral as a second feature amount, and
   the aberration correction circuitry corrects astigmatic aberration of multiple beams based on the first feature amount and the second feature amount.

10. A method of adjusting a multi charged particle beam writing apparatus, the method comprising:
    emitting a charged particle beam;
    forming multiple beams by allowing the charged particle beam to pass through a plurality of openings of an aperture plate;
    irradiating a substrate placed on a stage with the multiple beams;
    detecting a reflection charged particle from the substrate;
    calculating a feature amount of an aperture image based on the detected reflection charged particle; and
    correcting aberration of the charged particle beam based on the feature amount.

11. The method according to claim 10, wherein
    an approximate graphic that approximates the aperture image is generated,
    the feature amount is calculated using an area of the aperture image positioned at least one of inside and outside the approximate graphic, and
    spherical aberration of the charged particle beam is corrected based on the feature amount.

12. The method according to claim 10, wherein
    an approximate quadrilateral that approximates the aperture image is generated, and a ratio between a length of a longer one of diagonal lines of the approximate quadrilateral and a length of an outer edge of the aperture image is calculated as the feature amount, and
    spherical aberration of the charged particle beam is corrected based on the feature amount.

13. The method according to claim 10, wherein
standard deviation of illuminance in the aperture image is calculated as the feature amount, and
spherical aberration of the charged particle beam is corrected based on the feature amount.

14. The method according to claim 10, wherein
a rectangle that approximates the aperture image is generated, and a ratio between a long side and a short side of the rectangle is calculated as the feature amount, and
spherical aberration of the charged particle beam is corrected based on the feature amount.

15. The method according to claim 10, wherein
a circle that approximates the aperture image is generated, and a ratio between a diameter of the circle and a length of an outer edge of the aperture image is calculated as the feature amount, and
spherical aberration of the charged particle beam is corrected based on the feature amount.

16. The method according to claim 10, wherein
an approximate quadrilateral that approximates the aperture image is generated, and variation in lengths of four sides of the approximate quadrilateral is calculated as a first feature amount, and
astigmatic aberration of multiple beams is corrected based on the first feature amount.

17. The method according to claim 10, wherein
an approximate quadrilateral that approximates the aperture image is generated, and squareness of four interior angles of the approximate quadrilateral is calculated as a second feature amount, and
astigmatic aberration of multiple beams is corrected based on the second feature amount.

18. The method according to claim 10, wherein
an approximate quadrilateral that approximates the aperture image is generated, variation in lengths of four sides of the approximate quadrilateral is calculated as a first feature amount, and squareness of four interior angles of the approximate quadrilateral is calculated as a second feature amount, and
astigmatic aberration of multiple beams is corrected based on the first feature amount and the second feature amount.

* * * * *